(12) United States Patent
Takinomi

(10) Patent No.: US 7,608,925 B2
(45) Date of Patent: Oct. 27, 2009

(54) RELAY BOARD WITH BONDING PADS CONNECTED BY WIRINGS

(75) Inventor: Yutaka Takinomi, Kawasaki (JP)

(73) Assignee: Fujitsu Microelectronics Limited, Tokyo (JP)

( * ) Notice: Subject to any disclaimer, the term of this patent is extended or adjusted under 35 U.S.C. 154(b) by 197 days.

(21) Appl. No.: 11/234,388

(22) Filed: Sep. 26, 2005

(65) Prior Publication Data
US 2007/0018339 A1 Jan. 25, 2007

(30) Foreign Application Priority Data
Jul. 20, 2005 (JP) .............................. 2005-210390

(51) Int. Cl.
*H01L 23/34* (2006.01)
*H01L 21/00* (2006.01)

(52) U.S. Cl. ................. 257/724; 257/777; 257/782; 257/784; 438/123

(58) Field of Classification Search ................. None
See application file for complete search history.

(56) References Cited

U.S. PATENT DOCUMENTS

| | | | |
|---|---|---|---|
| 5,864,177 A * | 1/1999 | Sundstrom ................ | 257/723 |
| 6,689,636 B2 | 2/2004 | Liao et al. | |
| 6,770,963 B1 | 8/2004 | Wu | |
| 6,787,915 B2 * | 9/2004 | Uchida et al. .............. | 257/777 |
| 6,790,760 B1 | 9/2004 | Cohn et al. | |
| 6,836,002 B2 * | 12/2004 | Chikawa et al. ............ | 257/666 |
| 6,979,905 B2 * | 12/2005 | Nishida et al. ............. | 257/777 |
| 7,078,792 B2 * | 7/2006 | Lam et al. .................. | 257/686 |
| 7,271,031 B2 * | 9/2007 | Lam et al. .................. | 438/109 |
| 2005/0253278 A1 | 11/2005 | Lam et al. | |
| 2006/0216866 A1 | 9/2006 | Lam et al. | |

FOREIGN PATENT DOCUMENTS

| | | |
|---|---|---|
| CN | 1497720 A | 5/2004 |
| CN | 1947247 A | 4/2007 |
| JP | 61-112346 | 5/1986 |
| JP | 8-78467 | 3/1996 |
| JP | 2001-7278 | 1/2001 |
| JP | 2004-56023 | 2/2004 |
| KR | 2004-0070020 A | 8/2004 |

OTHER PUBLICATIONS

Office Action dated Sep. 26, 2006 issued in corresponding Korean Patent Application 10-2005-0094315.
Chinese Office Action dated Dec. 21, 2007, issued in corresponding Chinese Patent Application No. 200510113636.8.
Chinese Office Action dated Nov. 21, 2008, issued in corresponding Chinese Patent Application No. 2005101136368.

\* cited by examiner

*Primary Examiner*—Alonzo Chambliss
(74) *Attorney, Agent, or Firm*—Westerman, Hattori, Daniels & Adrian, LLP

(57) ABSTRACT

A relay board provided in a semiconductor package where a plurality of semiconductor chips are provided, the relay board relaying a wire for wiring the semiconductor chips or a wire for wiring a lead frame of the semiconductor package and the semiconductor chip, the relay board includes a plurality of wirings each of the wirings connecting at least three bonding pads.

5 Claims, 13 Drawing Sheets

(A)

(B)

RELAY BOARD WITH BONDING PADS CONNECTED BY WIRINGS

BACKGROUND OF THE INVENTION

1. Field of the Invention

The present invention generally relates to relay boards and semiconductor devices having the relay boards, and more specifically, to a relay board provided in a semiconductor device having a structure where plural semiconductor chips are received in a single semiconductor package, for example, the relay board used for wiring the semiconductor chips or the semiconductor chip and a lead frame of the semiconductor package, and the semiconductor device having the relay board.

2. Description of the Related Art

It is well known to make a single package wherein plural chips having different functions are provided in a semiconductor package by using SiP (System in Package) technology. In a case where the plural semiconductor chips are provided in the single semiconductor package by using such a technology, it is necessary to wire-bond the semiconductor chips per se directly or wire-bond the individual semiconductor chips and the lead frame of the semiconductor package.

FIG. 1 is a plan view showing a related art semiconductor device using the SiP technology. Referring to FIG. 1, in a related art semiconductor device 10, a first semiconductor chip 11 is provided on a lead frame having bonding pads 19. A second semiconductor chip 18 is stuck and fixed on the first semiconductor chip 11. Four bonding pads 12-1 through 12-4 of the second semiconductor chip 18 are respectively connected to bonding pads 9-1 through 9-4 among bonding pads 9 provided at four sides of the first semiconductor chip 11. The bonding pad 9 of the first semiconductor chip 11 is connected to the bonding pad 19 of the lead frame by a bonding wire 17 for the lead frame.

However, in a case where plural semiconductor chips 11 and 18 are stuck together as in this case, the bonding wires such as bonding wires 13 and 14 for the first semiconductor chip 11 are overlapped, and wire lengths of the wires such as bonding wires 15 and 16 for the first semiconductor chip 11 are too long.

In order to solve such problems, as shown in FIG. 2 and FIG. 3, examples where a terminal chip for relaying a wiring by the bonding wire is provided in the semiconductor package are suggested.

FIG. 2 is a plan view of a first example of the related art semiconductor device where a terminal chip is provided. Referring to FIG. 2, in a semiconductor device 20, a terminal chip 25 is put between the first semiconductor chip 11 and the second semiconductor chip 18. Eight bonding pads 26 are formed in the terminal chip 25. In addition, four metal wirings 27 each connecting two bonding pads 26 are provided in the terminal chip 25. For example, one connected pair of the bonding pads 26 is connected to the bonding pad 12 of the second semiconductor chip 18 via the first bonding wire 24, the bonding pad 9 of the first semiconductor chip 11 via the first bonding wire 28, and the bonding pad 19 of the lead frame via the third bonding wire 29. Under this structure, the terminal chip 25 relays through the bonding wires 24, 28 and 29 so that the wire lengths may be shortened more than in the structure shown in FIG. 1.

FIG. 3 is a plan view of a second example of the related art semiconductor device where the terminal chip is provided. Referring to FIG. 3, in a semiconductor device 30, the second semiconductor chip 18 and a terminal chip 35 are provided on the first semiconductor chip 11 side by side. Six bonding pads 36 are formed in the terminal chip 35. Furthermore, three metal wirings 37 connecting two bonding pads 36 are provided in the terminal chip 35. Among the bonding pads 36 to which metal wirings 37 at a left side and in the middle of the terminal chip 35 are connected in FIG. 3, a bonding pad 36-1 is connected to the bonding pad 12 of the second semiconductor chip 18 via the first bonding wire 38. A bonding pad 36-2 is connected to the bonding pad 9 of the first semiconductor chip 11 via the second bonding wire 39 and further connected to the bonding pad 19 of the lead frame via the bonding wire 17 for the lead frame. Under this structure, the terminal chip 35 relays through the bonding wires 38 and 39 so that the overlapping of the bonding wires as in the structure shown in FIG. 1 is avoided. See Japan Laid-Open Patent Application Publications No. 61-112346, No. 8-78467, No. 2001-7278, and No. 2004-56023.

However, a size of the semiconductor chip being relayed for the terminal chip and the number or arrangement of the bonding pads formed in the semiconductor chip are varied. Therefore, even if a terminal chip is proper for the design of a certain semiconductor package, the terminal chip may not be always proper for the design of other semiconductor packages. That is, the terminal chips 25 and 35 shown in FIG. 2 and FIG. 3 may not always be proper for combination with semiconductor chips other than the semiconductor chips shown in FIG. 2 and FIG. 3.

Therefore, in the related art, it is necessary to manufacture and prepare a terminal chip for every design of or combination with one semiconductor chip mounted on another semiconductor chip.

The terminal chip which can be used for only a specific combination of the mounted semiconductor chip requires a long developing term and a high manufacturing cost.

SUMMARY OF THE INVENTION

Accordingly, it is a general object of the present invention to provide a novel and useful relay board and semiconductor device having the relay board.

Another and more specific object of the present invention is to provide a relay board which can be widely and commonly used for not only a specific combination with a semiconductor chip relayed for by the relay board but also various combinations of the semiconductor chip and others, and a semiconductor device having the relay board.

The above object of the present invention is achieved by a relay board provided in a semiconductor package where a plurality of semiconductor chips are provided, the relay board relaying a wire for wiring the semiconductor chips or a wire for wiring a lead frame of the semiconductor package and the semiconductor chip, the relay board including:

a plurality of wirings each of the wirings connecting at least three bonding pads.

The above object of the present invention is also achieved by a semiconductor device having a structure wherein a relay board is provided on a first semiconductor chip, a second semiconductor chip is provided on the relay board, and the first semiconductor chip, the second semiconductor chip, and the relay board are packaged, the relay board relaying a wire for wiring the semiconductor chips or a wire for wiring a lead frame of the semiconductor device and the semiconductor chip, including:

a plurality of wirings each of the wirings connecting at least three bonding pads.

The above object of the present invention is also achieved by a semiconductor device having a structure wherein a first semiconductor chip is provided on a relay board, a second semiconductor chip is provided on the first semiconductor chip, and the first semiconductor chip, the second semiconductor chip, and the relay board are packaged, the relay board relaying a wire for wiring the semiconductor chips or a wire for wiring a lead frame of the semiconductor device and the semiconductor chip, including:

a plurality of wirings each of the wirings connecting at least three bonding pads.

The above object of the present invention is also achieved by a semiconductor device having a structure wherein a first semiconductor chip and a second semiconductor chip are provided on a relay board side by side, and the first semiconductor chip, the second semiconductor chip, and the relay board are packaged, the relay board relaying a wire for wiring the semiconductor chips or a wire for wiring a lead frame of the semiconductor device and the semiconductor chip, including:

a plurality of wirings each of the wirings connecting at least three bonding pads.

The above object of the present invention is also achieved by a semiconductor device having a structure wherein a second semiconductor chip and a relay board are provided on a first semiconductor chip side by side, and the first semiconductor chip, the second semiconductor chip, and the relay board are packaged, the relay board relaying a wire for wiring the semiconductor chips or a wire for wiring a lead frame of the semiconductor device and the semiconductor chip, including:

a plurality of wirings each of the wirings connecting at least three bonding pads.

DETAILED DESCRIPTION OF THE PREFERRED EMBODIMENTS

A description is given below, with reference to the FIG. 4 through FIG. 15 of embodiments of the present invention. For the convenience of explanation, a terminal chip of the embodiment of the present invention is discussed with reference to FIG. 4 through FIG. 10, and then a semiconductor device of the embodiment of the present invention is discussed with reference to FIG. 11 through FIG. 15.

[Terminal Chip]

A terminal chip of the present invention is provided in the semiconductor device and functions as a relay board of a semiconductor chip provided in the semiconductor device.

A terminal chip of the first embodiment of the present invention is discussed with reference to FIG. 4 through FIG. 6.

Figure 4:
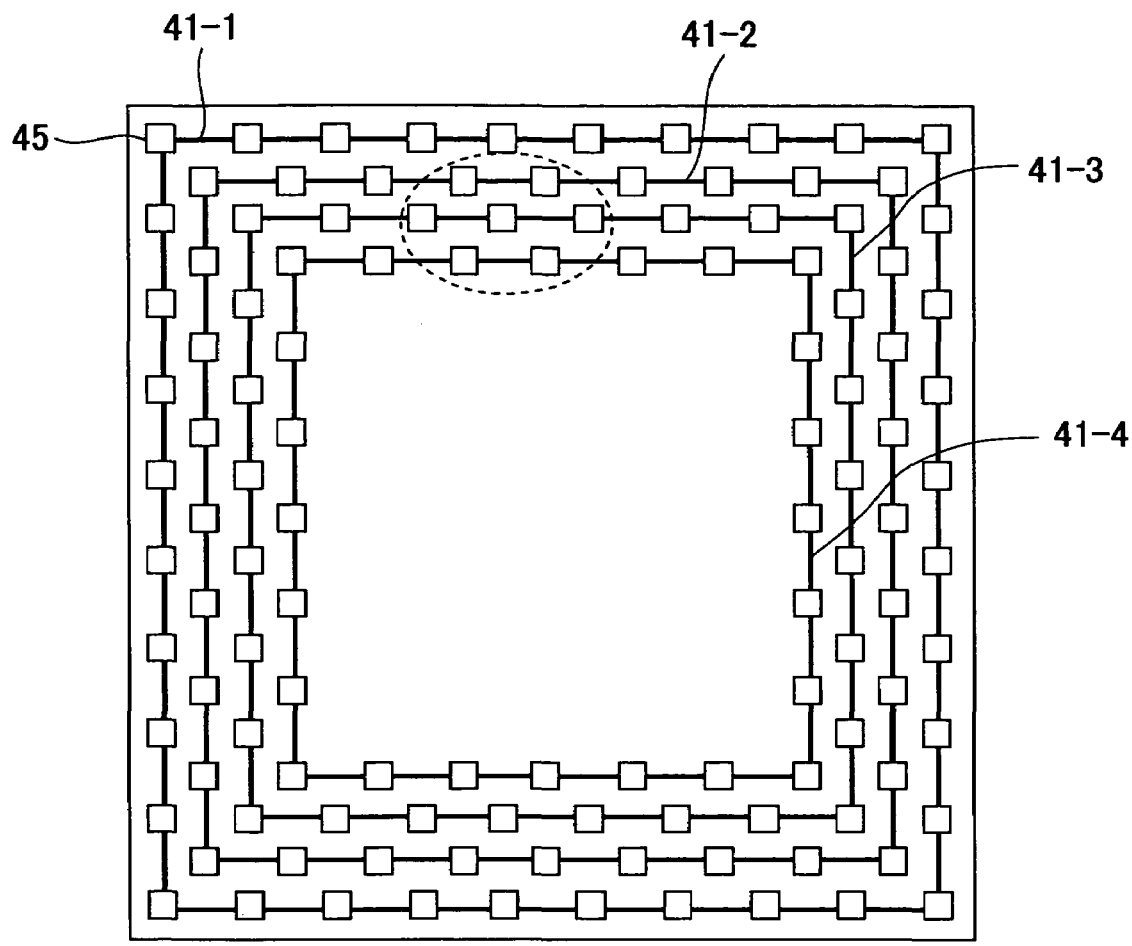
FIG. 4 is a plan view of a terminal chip of a first embodiment of the present invention.

FIG. 4 is a plan view of the terminal chip of the first embodiment of the present invention. Referring to FIG. 4, a terminal chip 40 of the first embodiment of the present invention has a substantially rectangular-shaped configuration. Four wirings 41-1 through 41-4 made of metal are provided along four sides of the terminal chip 40 in a concentric state. Bonding pads 45 are connected by the metal wiring 41. More specifically, three or more bonding pads 45 are formed in each of the metal wirings 41-1 through 41-4 with a designated gap.

As discussed below with reference to FIG. 11, the terminal chip 40 of this embodiment is put between, for example, a certain semiconductor chip having an area larger than the terminal chip 40 and another semiconductor chip having an area small than the terminal chip 40 and provided at a part where the metal wirings 41-1 through 41-4 are not provided. Bonding pads 45 of the terminal chip 40 are connected to bonding pads formed in the respective semiconductor chips via a designated bonding wire.

As discussed with reference to FIG. 2 and FIG. 3, in the related art terminal chip, a couple of the bonding pads, namely only two bonding pads, are provided for a single metal wiring. However, in the terminal chip 40 of this embodiment shown in FIG. 4, three or more bonding pads 45 are provided in a single metal wiring 41. Therefore, it is possible to use and properly select the bonding pad 45 positioned suitable for the combination of the semiconductor chip.

Furthermore, as discussed above, plural metal wirings 41 are provided in the terminal chip 40 of this embodiment. Therefore, it is possible to properly select the metal wiring 41 suitable for the combination of the semiconductor chip and use and properly select the bonding pad 45 provided in the metal wiring 41.

A substrate of the terminal chip 40 is, for example, made of silicon which is a material for the semiconductor chip. Therefore, the generation of strain due to the difference of the thermal expansion rate of the semiconductor chip material can be avoided. However, the material for the terminal chip of this embodiment is not limited to silicon. For example, a thin-type substrate of ceramic, phenol resin (Bakelite), glass epoxy, or the like or a resin film, a polyimide film, a polyethylene terephthalate film, or the like, may be used for the material for the terminal chip.

Figure 5:
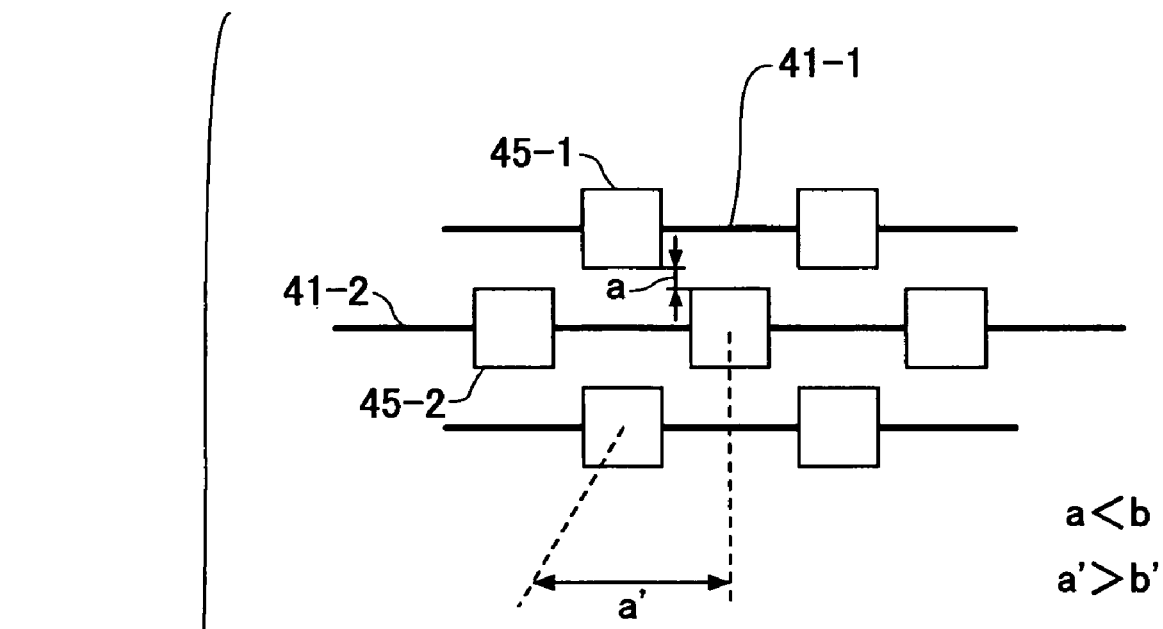
FIG. 5 is an enlarged view of the part surrounded by the dotted line in FIG. 4 and a view for comparing with a case where the position of a bonding pad of a metal wiring is made uniform with the position of a bonding pad of another metal wiring in a direction perpendicular to the direction in which the metal wirings are provided.
Figure 5:
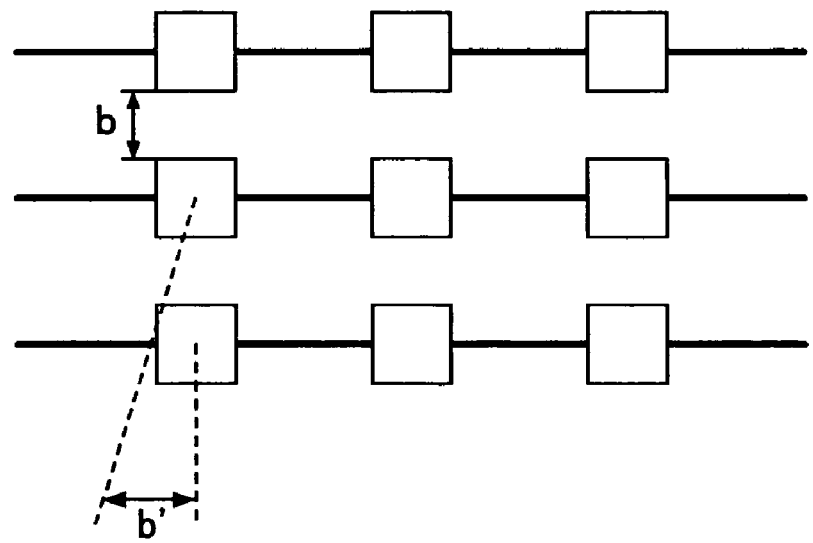

FIG. 5-(A) is an enlarged view of a part surrounded by a dotted line in FIG. 4. FIG. 5-(B) is a view for comparing with a case where a position of a bonding pad of a metal wiring is made uniform with a position of a bonding pad of another metal wiring in a direction perpendicular to the direction in which the metal wirings are provided.

Referring to FIG. 5-(A), in the terminal chip 40 shown in FIG. 4, a position of a bonding pad 45-1 of a metal wiring 41-1 is shifted from a position of a bonding pad 45-2 of another metal wiring 41-2 neighboring the metal wiring 41-1 in a direction where the metal wirings 41-1 and 41-2 are provided. Therefore, a gap "a" formed between the bonding pad 45-1 of the metal wiring 41-1 and the bonding pad 45-2 of the other metal wiring 41-2 can be made smaller than a gap "b" formed between the bonding pad of the metal wiring and the bonding pad of the neighboring metal wiring made uniform in the direction perpendicular to the direction in which the metal wiring are provided, namely a<b. Therefore, it is possible to make the size of the terminal chip small by making the structure shown in FIG. 5-(A).

In FIG. 5-(A) and FIG. 5-(B), bonding wires connecting to the bonding pads 45 are shown by dotted lines. In the structure shown in FIG. 5-(B), a bonding wire connecting to the bonding pad provided on a metal wiring passes above a bonding pad provided on the other neighboring metal wiring. On the other hand, a gap "a'" between two bonding wires in the structure shown in FIG. 5-(A) can be made larger than a gap "b'" between two bonding wires in a structure shown in FIG. 5-(B), namely a'>b'. Accordingly, by making the structure shown in FIG. 5-(A), it is possible to wire-bond without passing above other bonding pads easier than making the structure shown in FIG. 5-(B). Meanwhile, an arrangement of the bonding pads in the terminal chip is not limited to the example discussed above.

In the example shown in FIG. 4, the metal wirings 41 provided in the terminal chip 40 have a closed-loop structure. However, the present invention is not limited to the example shown in FIG. 4. For example, the metal wiring may have a structure shown in FIG. 6. Here, FIG. 6 is a plan view of a modified example of the terminal chip 40 shown in FIG. 4.

Figure 6:
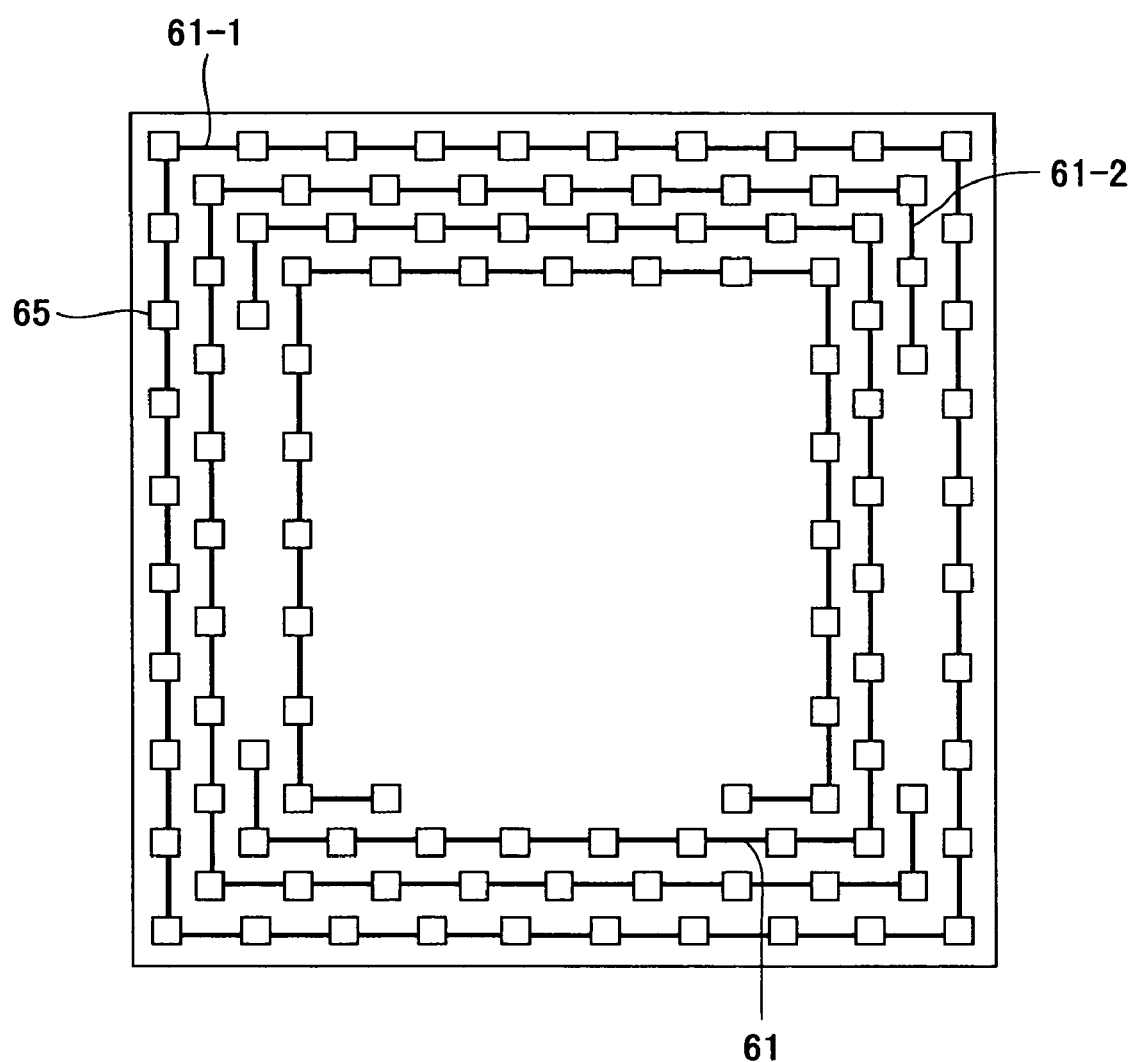
FIG. 6 is a plan view of a modified example of the terminal chip shown in FIG. 4.

Referring to FIG. 6, in this modified example, the metal wiring 61-1 is provided in a closed loop manner, while the metal wiring 61-2 is provided in a open loop manner wherein the loop is not completely closed but a part of the loop is opened.

In this example, plural metal wirings 61 are provided and three or more bonding pads are provided by a single metal wiring 61. Therefore, it is possible to select and use the bonding pad situated at a good position suitable for combination with the semiconductor chip.

The terminal chip 60 shown in FIG. 6, as well as the terminal chip 40 shown in FIG. 4, is put between, for example, a certain semiconductor chip having an area larger than the terminal chip 60 and another semiconductor chip having an area small than the terminal chip 60 and provided at a center part of the terminal chip 60 where the metal wirings 61 are not provided. Bonding pads 65 of the terminal chip 60 are connected to bonding pads formed in the respective semiconductor chips via designated bonding wire.

Next, a second embodiment of the terminal chip of the present invention is discussed with reference to FIG. 7 through FIG. 10.

Figure 7:
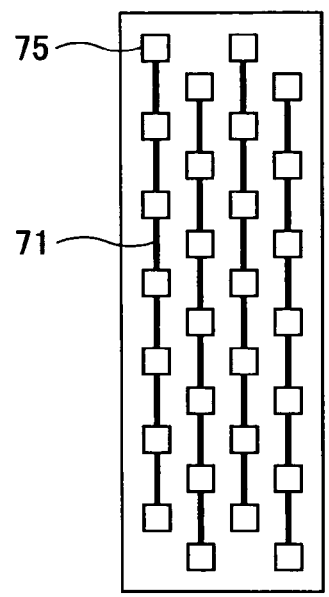
FIG. 7 is a plan view of a terminal chip of a second embodiment of the present invention.

FIG. 7 is a plan view of a terminal chip of a second embodiment of the present invention. Referring to FIG. 7, four metal wirings 71 are provided along a longitudinal side of the terminal chip 70 of the second embodiment of the present invention in a parallel manner. Three or more bonding pads 75 are formed in each of the metal wirings 71 with a designated gap.

As discussed below with reference to FIG. 14, the terminal chip 40 of this embodiment and a certain semiconductor chip are provided side by side on other semiconductor chip. Bonding pads 75 of the terminal chip 70 are connected to bonding pads formed in the respective semiconductor chips via designated bonding wire.

In this embodiment, as well as the first embodiment, the wirings 71 made of metal are provided in the terminal chip 70. Three or more bonding pads 75 are provided in a single metal wiring 71. Therefore, it is possible to select and use the bonding pad situated at a good position suitable for combination with the semiconductor chip.

In this embodiment, as well as the first embodiment, the position of a bonding pad of a metal wiring is shifted from a position of a bonding pad of another metal wiring neighboring the metal wiring in a direction where the metal wirings are provided. However, the present invention is not limited to this.

Figure 8:
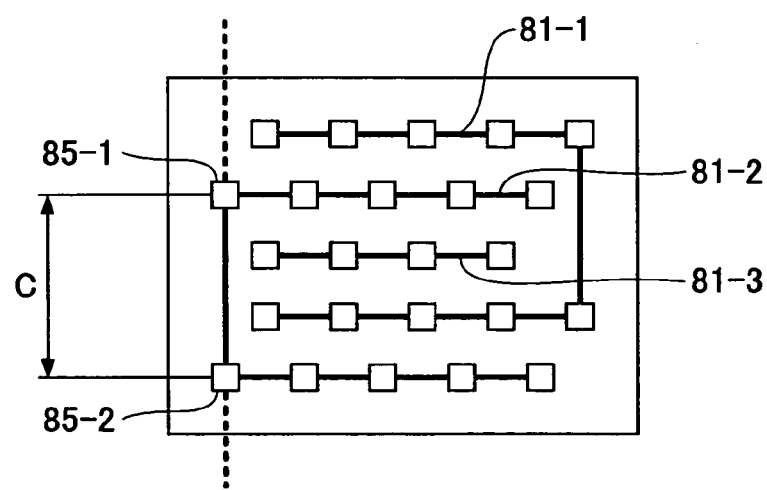
FIG. 8 is a plan view of a terminal chip of a first modified example of the terminal chip of the second embodiment of the present invention shown in FIG. 7.
Figure 9:
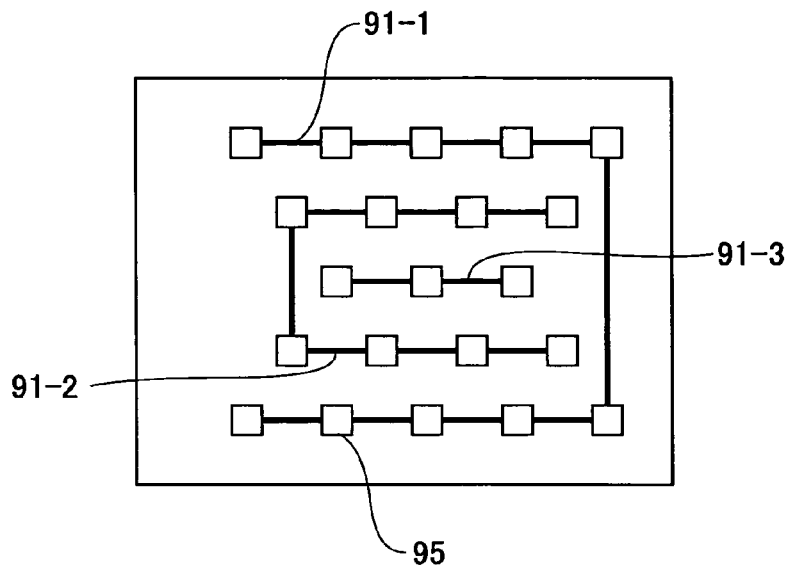
FIG. 9 is a plan view of a terminal chip of a second modified example of the terminal chip of the second embodiment of the present invention shown in FIG. 7.
Figure 10:
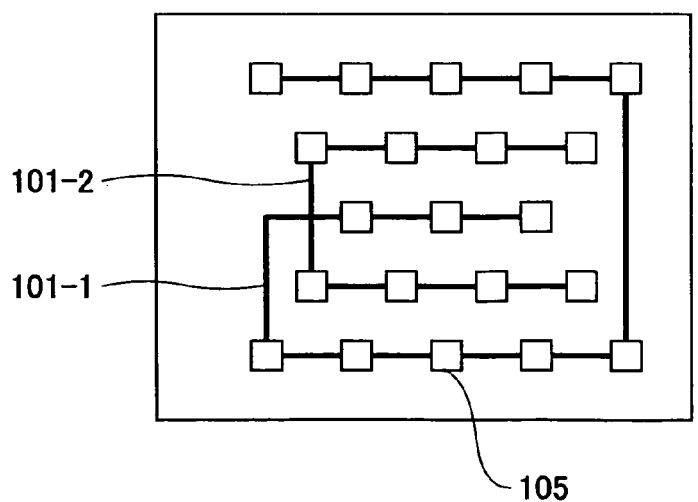
FIG. 10 is a plan view of a terminal chip of a third modified example of the terminal chip of the second embodiment of the present invention shown in FIG. 7.

In an example shown in FIG. 7, four metal wirings 71 are provided in parallel. However, the present invention is not limited to this. The arrangement of the metal wirings 71 may be one of the structure shown in FIG. 8 through FIG. 10. Here, FIG. 8 is a plan view of a terminal chip of a first modified example of the terminal chip of the second embodiment of the present invention shown in FIG. 7. FIG. 9 is a plan view of a terminal chip of a second modified example of the terminal chip of the second embodiment of the present invention shown in FIG. 7. FIG. 10 is a plan view of a terminal chip of a third modified example of the terminal chip of the second embodiment of the present invention shown in FIG. 7.

Referring to FIG. 8, a terminal chip 80 of a first modified example of the terminal chip 70 of the second embodiment of the present invention includes three metal wirings 81-1 through 81-3. More specifically, the metal wiring 81-2 formed in a substantially rectangular-shape lacking one side is provided so as to involve a part of the metal wiring 81-1 formed in a substantially rectangular-shape lacking one side. In addition, parts of the metal wirings 81-1 and 81-2 are provided in a direction substantially perpendicular to the direction in which the metal wiring 81-3 is provided. Therefore, for example, in a case where bonding wires are connected to two bonding pads 85-1 and 85-2 of the metal wiring 81-2 as shown by a dotted line in FIG. 8, the wire length of the bonding wire can be shortened by a length "C" as compared with a case having no such a structure. In the example shown in FIG. 8, parts of the metal wirings 81-1 and 81-2, that is a wiring part connecting the bonding pads 85-1 and 85-2, are provided in a direction substantially perpendicular to the direction where other parts of the metal wirings 81-1 and 81-2 are provided. However, the present invention is not limited to this. Parts of the metal wirings 81-1 and 81-2 may be bent at a designated angle.

Referring to FIG. 9, a terminal chip 90 of a second modified example of the terminal chip 70 of the second embodiment of the present invention includes three metal wirings 91-1 through 91-3. More specifically, the whole of the metal wiring 91-2 formed in a substantially rectangular-shape lacking one side is provided so as to be involved by the metal wiring 91-1 formed in a substantially rectangular-shape lacking one side. In addition, parts of the metal wirings 91-1 and 91-2 are provided in a direction substantially perpendicular to the direction in which the metal wiring 91-3 is provided. Therefore, the wire length of the bonding wire can be shortened as in the case shown in FIG. 8. In the example shown in FIG. 9, as well as the example shown in FIG. 8, parts of the metal wirings 91-1 and 91-2 are provided in a direction substantially perpendicular to the direction where other parts of the metal wirings 91-1 and 91-2 are provided. However, the present invention is not limited to this. Parts of the metal wirings 91-1 and 91-2 may be bent at a designated angle.

Next, referring to FIG. 10, a terminal chip 100 of the third modified example of the terminal chip 70 of the second embodiment of the present invention includes two metal wirings 101-1 and 101-2. The metal wiring 101-1 is provided in a first layer of the terminal chip 100. The metal wiring 101-2 is provided in the second layer provided on the first layer. Hence, plural metal wires crossing each other as shown in FIG. 10 can be provided by arranging plural layers where the metal wirings are provided and providing the metal wirings to separated layers.

In addition, the plural metal wirings 81-1 through 81-3, 91-1 through 91-3, or 101-1 through 101-2 are provided and three or more bonding pads 85, 95, or 105 are provided in a single metal wiring, in the examples shown in FIG. 8 through FIG. 10. Therefore, in the examples shown in FIG. 8 through FIG. 10, it is possible to use and properly select the bonding pad positioned suitable for the combination of the semiconductor chip.

The terminal chip 80, 90, or 100 shown in FIG. 8 through FIG. 10, as well as the terminal chip 70 shown in FIG. 7, and a certain semiconductor chip are provided side by side on another semiconductor chip. Bonding pads 85, 95, or 105 of the terminal chip 80, 90, or 100 are connected to bonding pads formed in the respective semiconductor chips via designated bonding wires.

[Semiconductor Device]

Next, an embodiment of the semiconductor device where the above-discussed terminal chip is provided is discussed.

In the following description, a first semiconductor chip and a second semiconductor chip have substantially rectangular configurations. A semiconductor memory, a semiconductor integrated circuit, or the like (not shown) may be formed on a substrate made of, for example, silicon.

Figure 11:
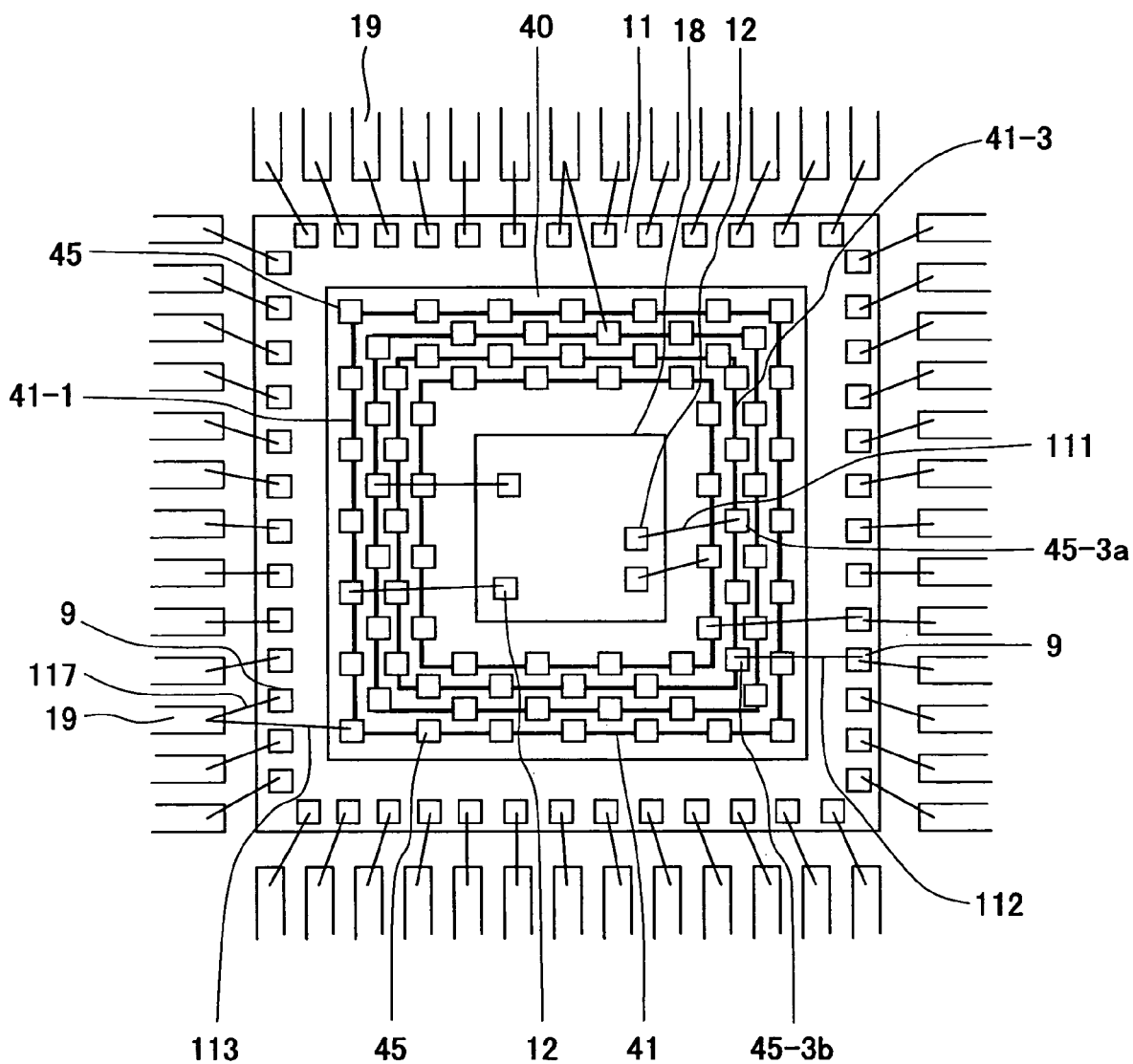
FIG. 11 is a plan view of a terminal chip of a third embodiment of the present invention.

FIG. 11 is a plan view of a terminal chip of a third embodiment of the present invention. Referring to FIG. 11, a semiconductor device 110 of the third embodiment of the present invention includes the first semiconductor chip 11, the second semiconductor chip 18, and the terminal chip 40 of the first embodiment of the present invention, or the like.

The first semiconductor chip 11 is provided on a lead frame having bonding pads 19. A number of bonding pads 9 are provided on the first semiconductor chip 11 along four sides of the first semiconductor chip 11. Parts of the bonding pads 9 are connected to the bonding pads 19 of the lead frame of the semiconductor device 110.

The terminal chip 40 of this embodiment is put between the first semiconductor chip having an area larger than the terminal chip 40 and the second semiconductor chip 18 having an area small than the terminal chip 40. The terminal chip 40 is fixed to an inside of a forming area of the bonding pads 9 situated at an external edge of the first semiconductor chip 11 by an adhesive (not shown in FIG. 11). As discussed with reference to FIG. 4, four wirings 41-1 through 41-4 made of metal are provided along four sides of the terminal chip 40 in a concentric state. Three or more bonding pads 45 are formed in each of the metal wirings 41-1 through 41-4 with a designated gap.

The second semiconductor chip 18 is fixed to the substantially center part of the terminal chip 40 where the metal wirings 41-1 through 41-4 are not provided. Four bonding pads 12 are provided on the second semiconductor chip 18.

Each of the four bonding pads 12 is connected to the bonding pad 45 of the terminal chip 40 via a bonding wire 111.

Among a number of bonding pads 45 provided on the terminal chip 40, a bonding pad 45 (bonding pad 45-3*b*, for example) on the metal wiring (metal wiring 41-3, for example) where another bonding pad (bonding pad 45-3*a*) connecting to the bonding wire 111 is provided, is connected to the bonding pad 9 of the first semiconductor chip 11 via the bonding wire 112, or another bonding pad 45 is connected to the bonding pads 19 of the lead frame of the semiconductor device 110 by the bonding wire 113. In addition, parts of the bonding pads 9 situated at four sides of the first semiconductor chip 11 are connected to the bonding pads 19 of the lead frame of the semiconductor device 110 by the bonding wire 117 for the lead frame.

Figure 1:
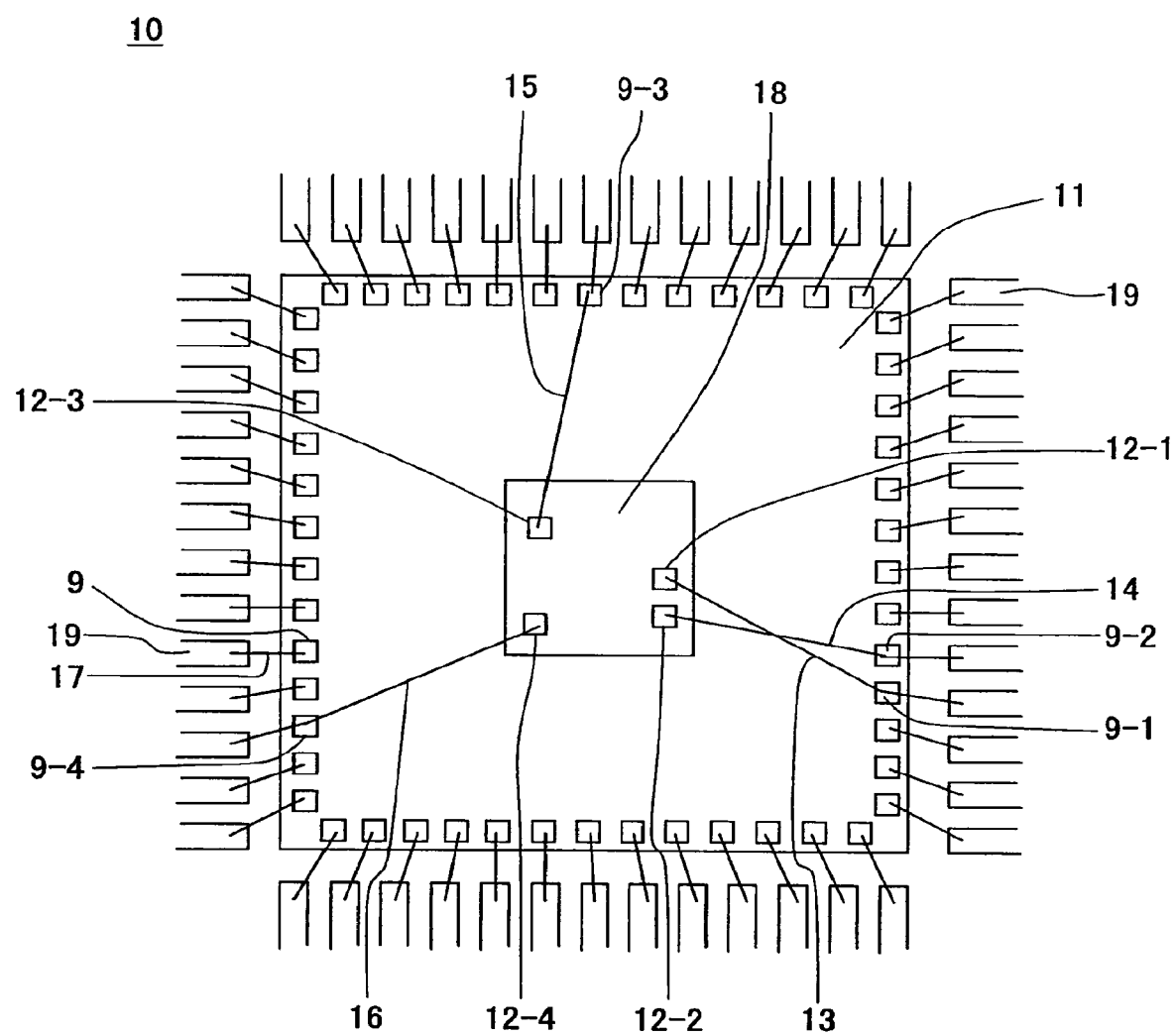
FIG. 1 is a plan view showing a related art semiconductor device using SiP technology.

Thus, in this example, the terminal chip 40 is used for wiring plural semiconductor chips such as the first semiconductor chip 11 and the second semiconductor chip 18, or wiring the semiconductor chip or the lead frame of the semiconductor package. In addition, the bonding pads 45 provided in the terminal chip 40 are used. Hence, it is possible to prevent a state of the semiconductor device 10 shown in FIG. 1, namely crossing of the bonding wires, so that the wire length can be shortened.

Figure 2:
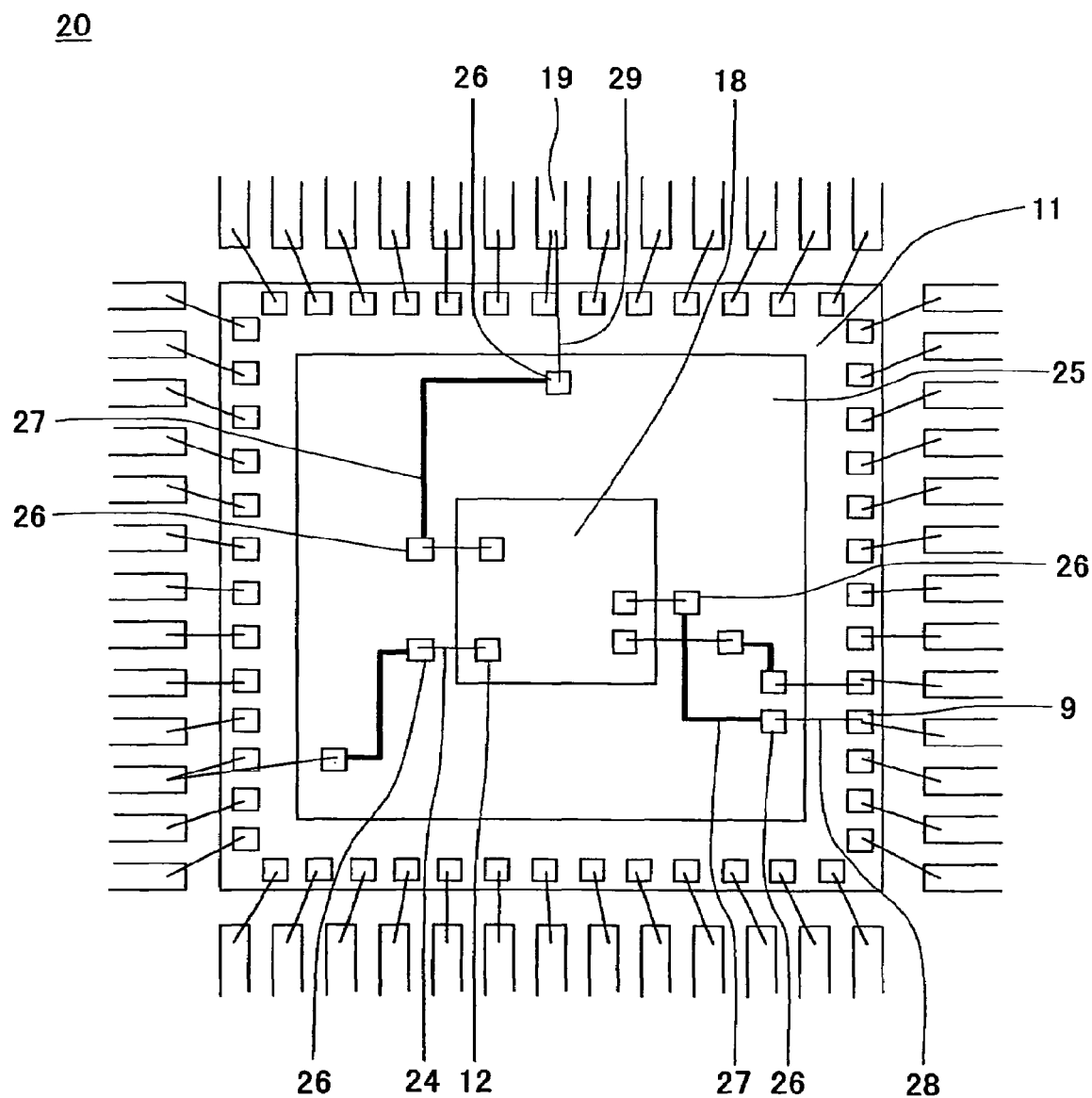
FIG. 2 is a plan view of a first example of the related art semiconductor device where a terminal chip is provided.

As compared with the first example of the semiconductor device 20 having the terminal chip 25 shown in FIG. 2, bonding pads more than the bonding pads provided on the terminal chip 25 are provided on the terminal chip 40 of the semiconductor device 110 shown in FIG. 11. More specifically, plural metal wirings 41 are provided on the terminal chip 30 and three or more bonding pads 45 are formed in each of the metal wirings 41.

Accordingly, irrespective of the structure of an arrangement of the bonding pads on the semiconductor chip relayed for by the terminal chip, it is possible to wire-bond the bonding pad of the terminal chip and the bonding pad of the semiconductor chip. Hence, according to the terminal chip of this embodiment, it is not necessary to change the structure of the terminal chip 40 for every combination of the relayed for semiconductor chip. Rather, the terminal chip 40 can be commonly used for the various combinations of the semiconductor chip. Hence, it is possible to reduce the manufacturing cost of the semiconductor device and shorten the term for developing the semiconductor device by mass manufacturing of the terminal chip.

The number of the bonding pads formed on the single metal wiring 41 is not limited to the example shown in FIG. 11. The more the number of the bonding pads, the higher the wide use of the terminal chip.

Although the terminal chip 40 shown in FIG. 4 of the first embodiment of the present invention is provided in the semiconductor device 110 shown in FIG. 11, the terminal chip 60 shown in FIG. 6 may be provided instead of the terminal chip 40, for example.

In addition, in the semiconductor device 110 shown in FIG. 11, the terminal chip 40 is provided on the first semiconductor chip 11 and the second semiconductor chip 18 is provided on the terminal chip 40. However, the present invention is not limited to this. A structure shown in FIG. 12 may be used. Here, FIG. 12 is a plan view of a terminal chip of a fourth embodiment of the present invention.

Figure 12:
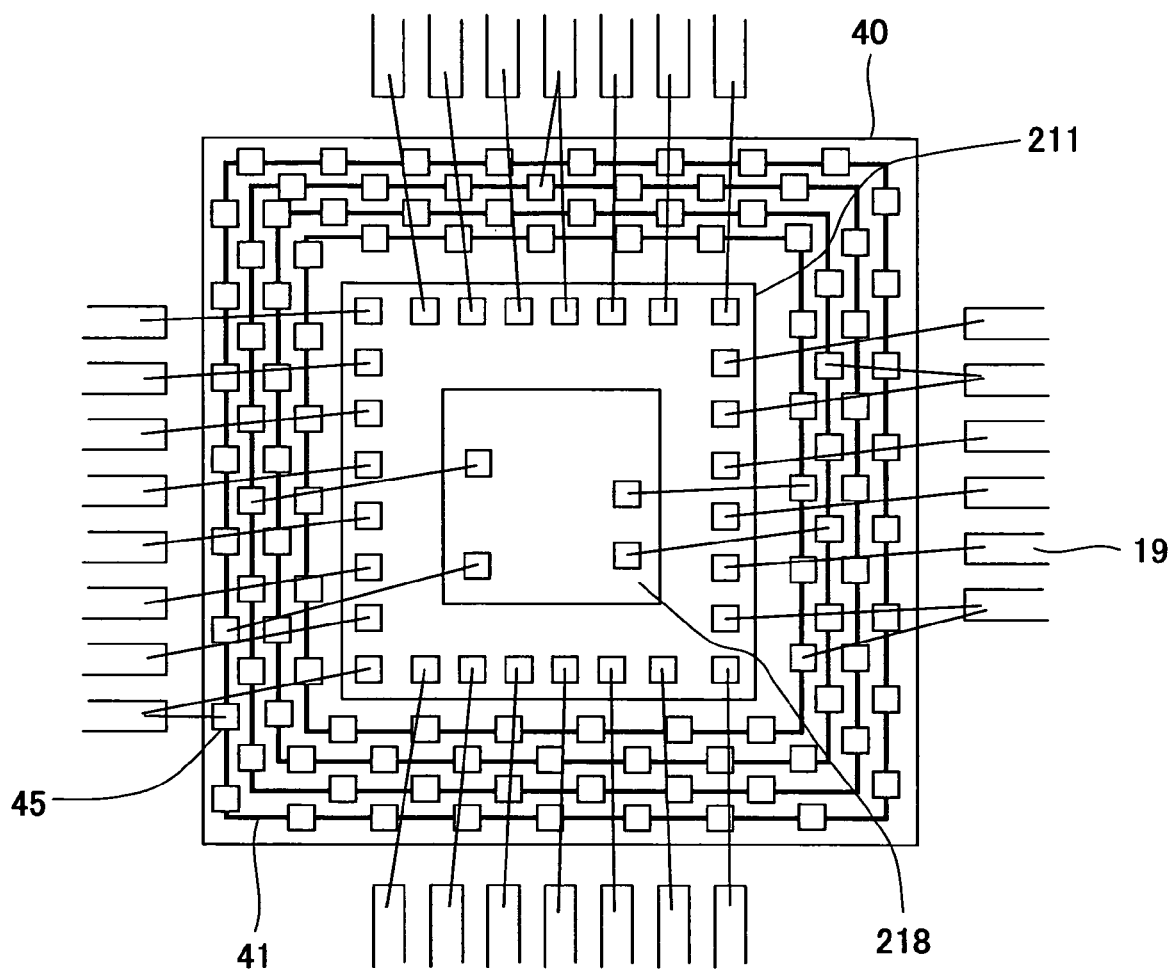
FIG. 12 is a plan view of a terminal chip of a fourth embodiment of the present invention.

Referring to FIG. 12, in the semiconductor device 120 of the fourth embodiment of the present invention, a first semiconductor chip 211 having an area smaller than the terminal chip 40 is provided on the terminal chip 40, and a second semiconductor chip 218 having an area smaller than the first semiconductor chip 211 is provided on the first semiconductor chip 211.

Thus, in this example, as well as the semiconductor device 110 of the third embodiment of the present invention, the terminal chip 40 is used for wiring plural semiconductor chips such as the first semiconductor chip 211 and the second semiconductor chip 218, or wiring the semiconductor chip and the bonding pad 19 of the lead frame of the semiconductor package. In addition, the bonding pads 45 provided in the terminal chip 40 are used. Hence, it is possible to prevent a state of the semiconductor device 10 shown in FIG. 1, namely crossing of the bonding wires, so that the wire length can be shortened.

In the example shown in FIG. 12, the terminal chip 60 shown in FIG. 6 may be used instead of the terminal chip 40.

Figure 13:
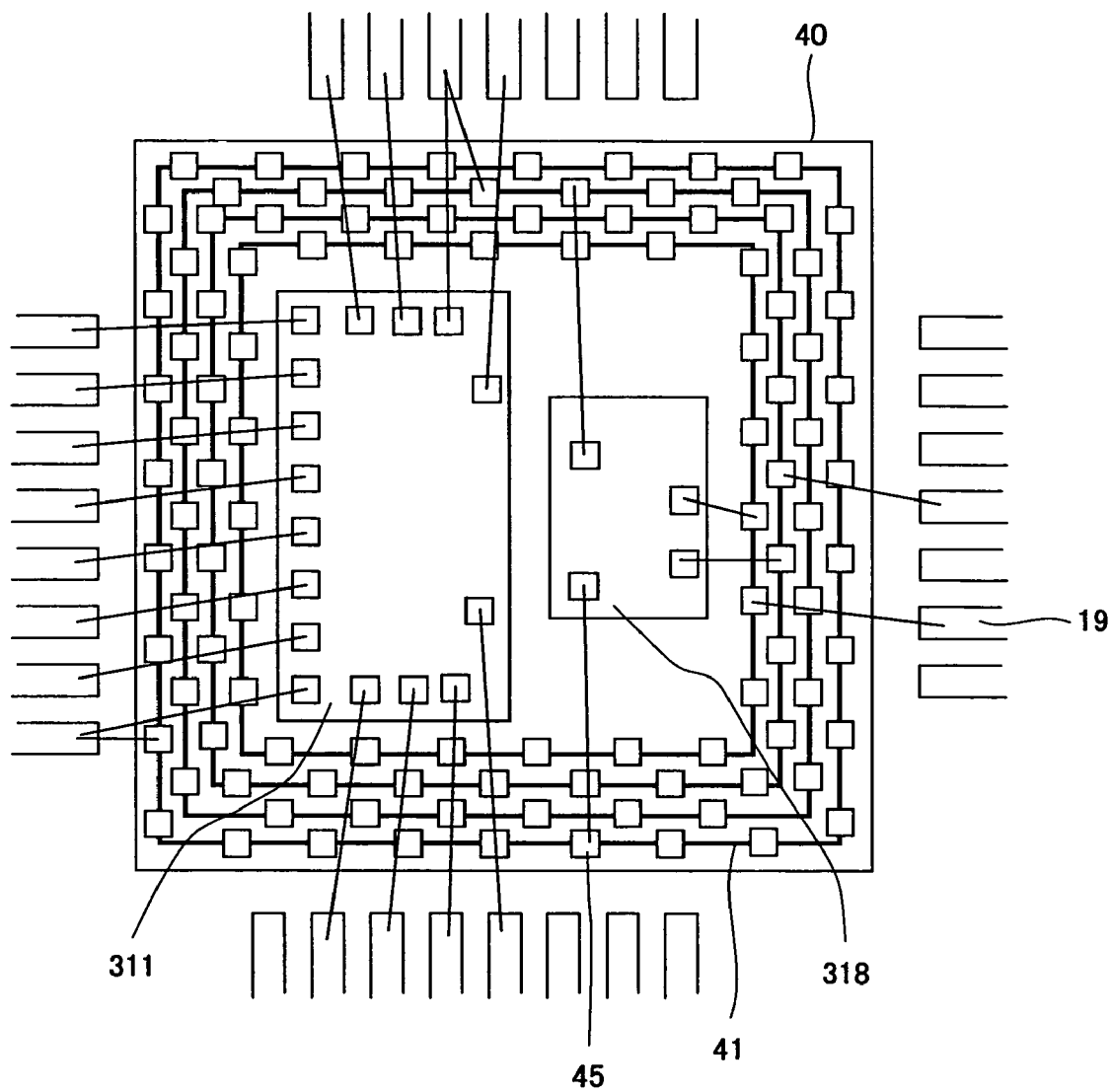
FIG. 13 is a plan view of a terminal chip of a fifth embodiment of the present invention.

The structure of the semiconductor device 110 may be a structure shown in FIG. 13. Here, FIG. 13 is a plan view of a terminal chip of a fifth embodiment of the present invention.

Referring to FIG. 13, in the semiconductor device 120 of the fifth embodiment of the present invention, the first semiconductor chip 311 and the second semiconductor chip 318 are provided side by side on the terminal chip 40. The terminal chip 40 has an area larger than the first semiconductor chip 311 and the second semiconductor chip 318.

Thus, in this example, as well as the semiconductor device 110 of the third embodiment of the present invention, the terminal chip 40 is used for wiring plural semiconductor chips such as the first semiconductor chip 311 and the second semiconductor chip 318, or wiring the semiconductor chip and the bonding pad 19 of the lead frame of the semiconductor package. In addition, the bonding pads 45 provided in the terminal chip 40 are used. Hence, it is possible to prevent a state of the semiconductor device 10 shown in FIG. 1, namely crossing of the bonding wires, so that the wire length can be shortened.

In the example shown in FIG. 13, the terminal chip 60 shown in FIG. 6 may be used instead of the terminal chip 40.

Figure 14:
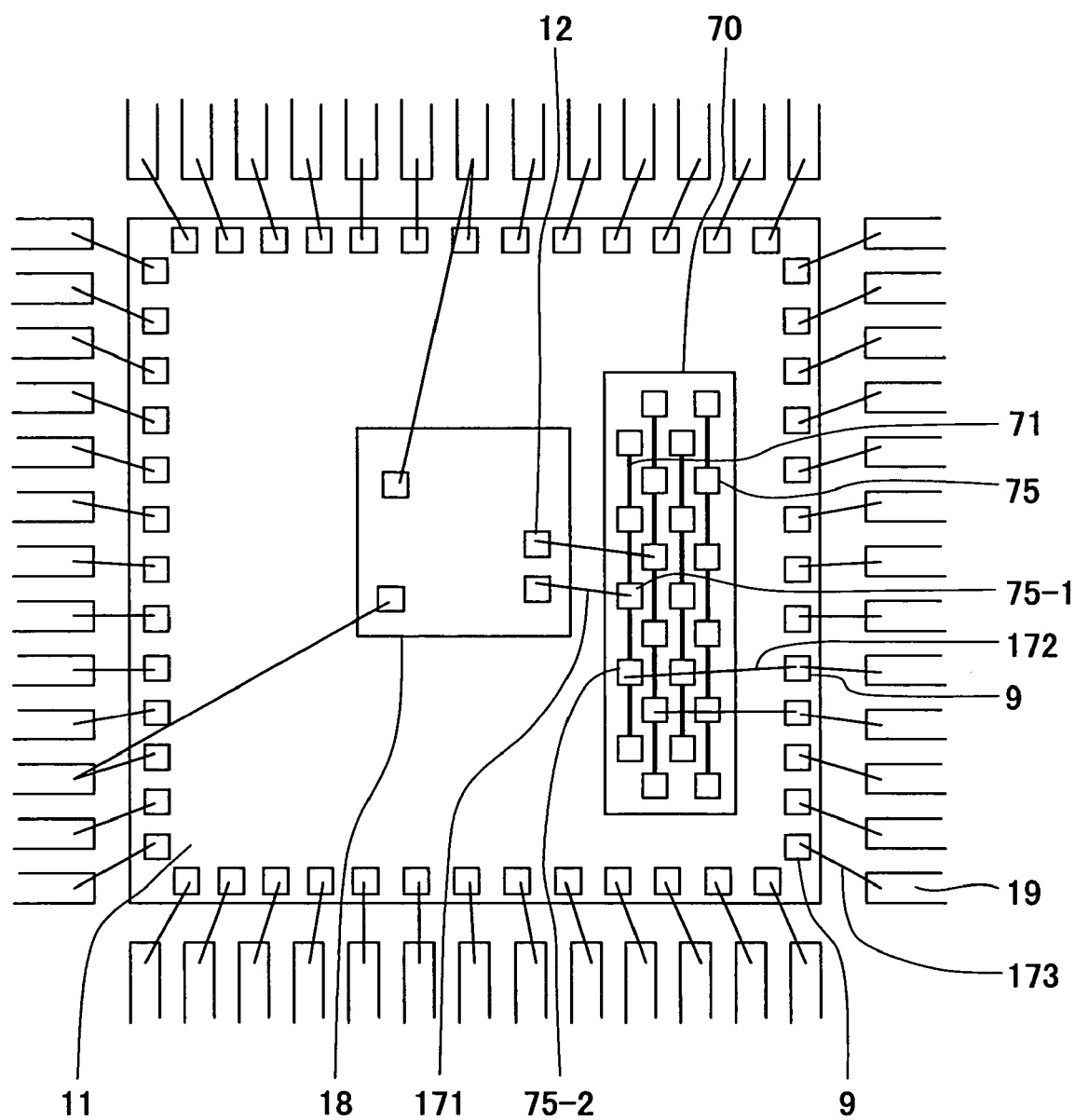
FIG. 14 is a plan view of a terminal chip of a sixth embodiment of the present invention.

FIG. 14 is a plan view of a terminal chip of a sixth embodiment of the present invention. Referring to FIG. 14, the semiconductor device 140 of the sixth embodiment of the present invention includes the terminal chip 70 of the second embodiment of the present invention. In the semiconductor device 140, the terminal chip 70 and the second semiconductor chip 18 are provided side by side on the first semiconductor chip 11. The terminal chip 70 and the second semiconductor chip 18 are fixed to the first semiconductor chip 11 by an adhesive (not shown in FIG. 14).

Since structures of the first semiconductor chip 11 and the second semiconductor chip 18 of this embodiment are the same as the first semiconductor chip 11 and the second semiconductor chip 18 of the third embodiment, the explanation thereof is omitted.

As described above, four metal wirings 71 are provided along a longitudinal side of the terminal chip 70 of the second embodiment of the present invention in a parallel manner. Three or more bonding pads 75 are formed in each of the metal wirings 71 with a designated gap.

Among a number of bonding pads 75 provided on the terminal chip 40, a bonding pad 75-2 on the metal wiring 71 where another bonding pad 75-1 connecting to the bonding wire 171 is provided, is connected to the bonding pad 9 of the first semiconductor chip 11 via the bonding wire 172. In addition, the bonding pad 9 is connected to the bonding pad 19 of the lead frame of the semiconductor device 110 by the bonding wire 173.

Thus, in this example, the terminal chip 70 is used for wiring plural semiconductor chips such as the first semiconductor chip 11 and the second semiconductor chip 18, or wiring the semiconductor chip and the bonding pad 19 of the lead frame of the semiconductor package. In addition, the bonding pads 75 provided in the terminal chip 70 are used. Hence, it is possible to prevent a state of the semiconductor device 10 shown in FIG. 1, namely crossing of the bonding wires, so that the wire length can be shortened.

Figure 3:
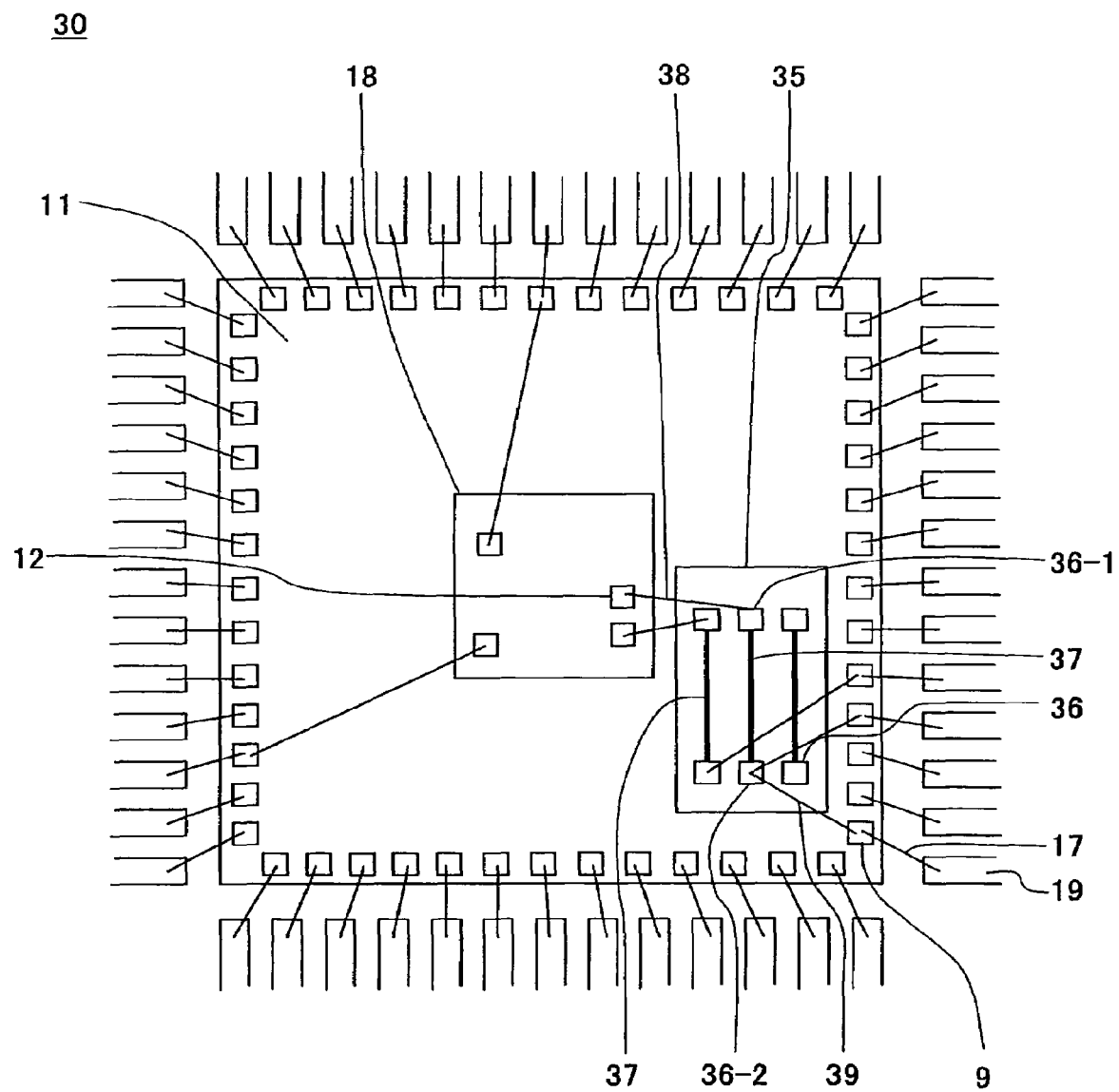
FIG. 3 is a plan view of a second example of the related art semiconductor device where the terminal chip is provided.

As compared with the second example of the semiconductor device 20 having the terminal chip 35 shown in FIG. 3, bonding pads more than the bonding pads provided on the terminal chip 35 are provided on the terminal chip 70 of the semiconductor device 140 shown in FIG. 14. More specifically, plural metal wirings 71 are provided on the terminal chip 70 and three or more bonding pads 75 are formed in each of the metal wirings 71.

Accordingly, as well as the semiconductor device 110 of the third embodiment of the present invention, irrespective of the structure of an arrangement of the bonding pads on the semiconductor chip relayed by the terminal chip, it is possible to wire-bond the bonding pad of the terminal chip and the bonding pad of the semiconductor chip. Hence, as compared with the terminal chip 35 shown in FIG. 3, the terminal chip 70 of this embodiment has a high wide-usefulness and it is possible to reduce the manufacturing cost of the semiconductor device and shorten the term for developing the semiconductor device by mass manufacturing of the terminal chip.

In this embodiment, as well as the semiconductor device 110 of the third embodiment of the present invention, the number of the bonding pads formed on the single metal wiring 71 is not limited to the number shown in FIG. 14. The more the number of the bonding pad, the higher the wide use of the terminal chip.

Figure 15:
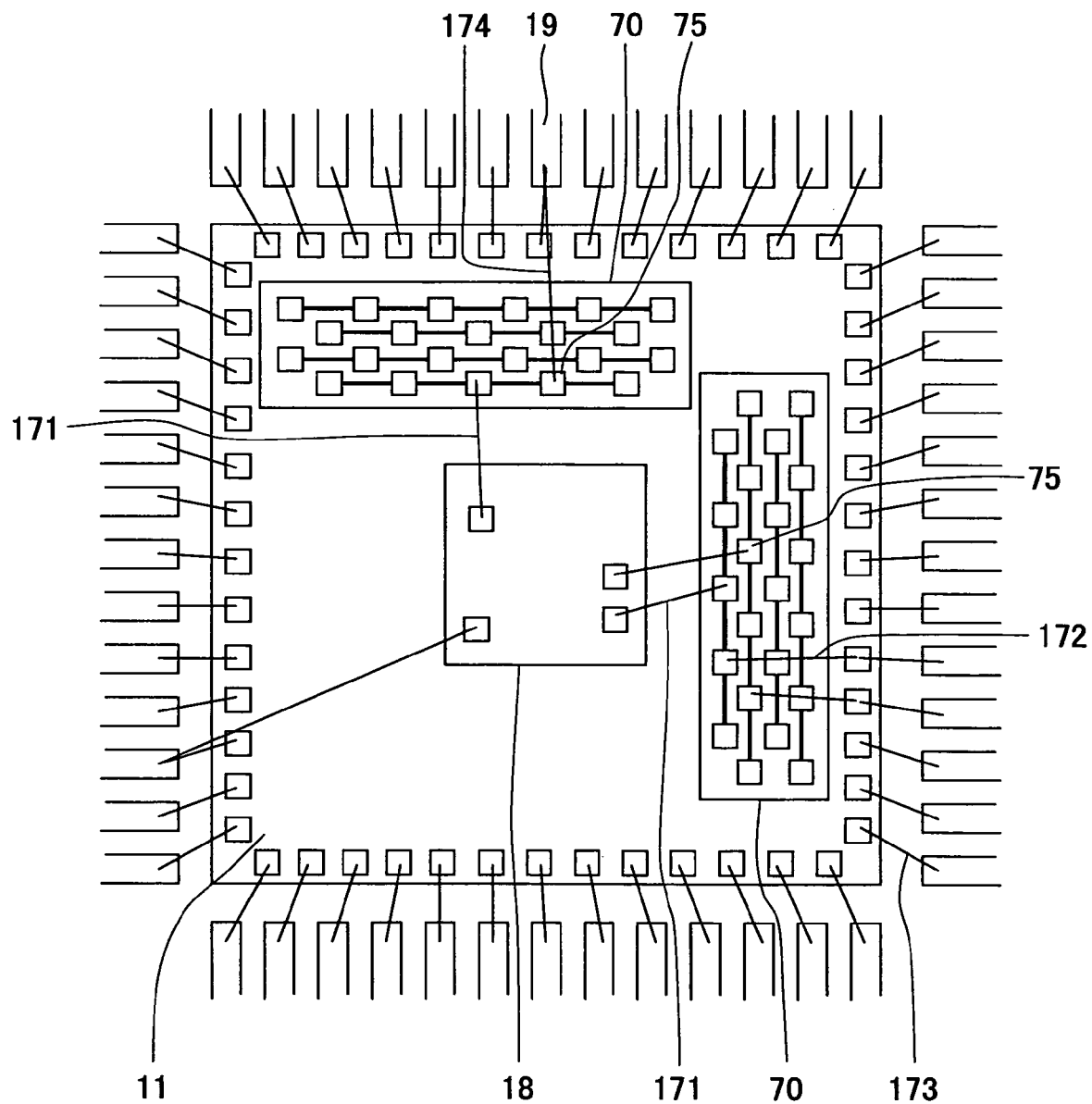
FIG. 15 is a plan view of a terminal chip of a seventh embodiment of the present invention.

FIG. 15 is a plan view of a terminal chip of a seventh embodiment of the present invention.

Referring to FIG. 15, the semiconductor device 150 of the seventh embodiment of the present invention includes two terminal chips 70 of the second embodiment of the present invention. The terminal chips 70 and the second semiconductor chip 18 are provided side by side on the first semiconductor chip 11.

As described above, as compared with the terminal chip 35 shown in FIG. 3, the terminal chip 70 can be widely-used and it is possible to correspond to the combination with the desirable semiconductor chip by providing plural terminal chips 70 as in this embodiment.

Thus, in this example, as well as the semiconductor device 140 of the sixth embodiment of the present invention, the terminal chip 70 is used for wiring plural semiconductor chips such as the first semiconductor chip 11 and the second semiconductor chip 18 by the bonding wires 171 and 172, or wiring the semiconductor chip and the bonding pad 19 of the lead frame of the semiconductor package by the bonding wire 174. In addition, the bonding pads 45 provided in the terminal chip 40 are used. Hence, it is possible to prevent a state of the semiconductor device 10 shown in FIG. 1, namely crossing of the bonding wires, so that the wire length can be shortened.

In the examples shown in FIG. 14 and FIG. 15, the terminal chip 70 and the second semiconductor chip 18 are provided side by side on the first semiconductor chip 11. However, the present invention is not limited to this. For example, the first semiconductor chip 11, the terminal chip 70, and the second semiconductor chip 18 may be properly provided on the same surface. It is possible to achieve the same effect in this case.

Thus, the terminal chip of the present invention can be widely and commonly used for not only a specific combination with a semiconductor chip relayed by the relay board but also various combinations of the semiconductor chip and others. Hence, the terminal chip of the present invention can be widely used and can be easily manufactured in large quantities. Hence, it is possible to reduce the manufacturing cost of the semiconductor device and shorten the term for developing the semiconductor device by mass manufacturing the terminal chip.

The present invention is not limited to these embodiments, but variations and modifications may be made without departing from the scope of the present invention.

For example, in the above-discussed embodiments, the terminal chip, the first semiconductor chip, and the second semiconductor chip are provided so that the bonding pads of the terminal chip, the first semiconductor chip, and the second semiconductor chip are exposed. However, the present invention is not limited to this. For example, the present invention may be used for a structure where a substrate where a printing wire is formed is provided under a single semiconductor chip and a bonding pad of the semiconductor chip is connected to the printed wire via a solder ball or the like so that the terminal chip is provided on the semiconductor chip.

This patent application is based on Japanese Priority Patent Application No. 2005-210390 filed on Jul. 20, 2005 and the entire contents of which are hereby incorporated by reference.

What is claimed is:

1. A semiconductor device having a structure wherein a relay board is provided on a first semiconductor chip, a second semiconductor chip is provided on the relay board, and the first semiconductor chip, the second semiconductor chip, and the relay board are packaged, the relay board relaying a wire for wiring the semiconductor chips or a wire for wiring a lead frame of the semiconductor device and the semiconductor chip, comprising:

a plurality of wirings each of the wirings connecting at least three bonding pads on the relay board, and each of the wiring provided in one of plurality of separated layers of the relay board, wherein the first semiconductor chip has an area larger than the relay board, and the second semiconductor chip has an area smaller than the relay board.

2. The relay board as claimed in claim 1, wherein the wirings are provided in a single layer of the plurality of separated layers.

3. The relay board as claimed in claim 1, wherein a material of the relay board is selected from a group consisting of silicon, ceramic, phenol resin, glass epoxy, a polyimide film, and a polyethylene terephthalate film.

4. A semiconductor device, comprising:

a lead frame;

a first semiconductor chip provided on the lead frame, the first semiconductor chip having a surface where a plurality of first pads are formed;

a relay board having an area smaller than an area of the first semiconductor chip, the relay board provided on the first semiconductor chip, the relay board having a surface where a plurality of second pads are formed; and a second semiconductor chip having an area smaller than an area of the relay board, the second semiconductor chip provided on the relay board, the second semiconductor chip having a surface where a plurality of third pads are formed, wherein a wiring connecting at least three of the second pads is formed in the relay board.

5. The semiconductor device as claimed in claim 4, further comprising:

a first bonding wire connecting one of the plurality of first pads and one of the at least three second pads to each other; and a second bonding wire connecting another one of the at least three second pads and one of the plurality of third pads to each other.

* * * * *

UNITED STATES PATENT AND TRADEMARK OFFICE
CERTIFICATE OF CORRECTION

Page 1 of 1

PATENT NO. : 7,608,925 B2
APPLICATION NO. : 11/234388
DATED : October 27, 2009
INVENTOR(S) : Yutaka Takinomi It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 266 days.

Signed and Sealed this
Third Day of May, 2011

David J. Kappos
*Director of the United States Patent and Trademark Office*